United States Patent
Jeon et al.

(10) Patent No.: US 9,340,684 B2
(45) Date of Patent: May 17, 2016

(54) CONDUCTIVE METAL INK COMPOSITION, AND METHOD FOR FORMING A CONDUCTIVE PATTERN

(75) Inventors: Kyoung Su Jeon, Seoul (KR); Jiehyun Seong, Daejeon (KR); Soo Yeon Heo, Daejeon (KR); Ji Young Hwang, Daejeon (KR); Jong Taik Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 615 days.

(21) Appl. No.: 13/697,337

(22) PCT Filed: May 6, 2011

(86) PCT No.: PCT/KR2011/003403
§ 371 (c)(1),
(2), (4) Date: Jun. 25, 2013

(87) PCT Pub. No.: WO2011/142558
PCT Pub. Date: Nov. 17, 2011

(65) Prior Publication Data
US 2013/0264104 A1    Oct. 10, 2013

(30) Foreign Application Priority Data
May 10, 2010    (KR) ................ 10-2010-0043431

(51) Int. Cl.
*H01B 1/02* (2006.01)
*H01B 1/22* (2006.01)
*H05K 1/09* (2006.01)
*H01C 17/06* (2006.01)
*C09D 5/24* (2006.01)
*C09D 11/52* (2014.01)
*C09D 11/033* (2014.01)

(52) U.S. Cl.
CPC ............ *C09D 5/24* (2013.01); *C09D 11/033* (2013.01); *C09D 11/52* (2013.01); *H01B 1/22* (2013.01); *H05K 1/092* (2013.01); *H05K 1/095* (2013.01)

(58) Field of Classification Search
None
See application file for complete search history.

(56) References Cited

U.S. PATENT DOCUMENTS

| 5,174,925 | A  | * | 12/1992 | Fujii et al. .................... 252/514 |
| 6,322,620 | B1 |   | 11/2001 | Xiao |
| 2005/0113489 | A1 | | 5/2005 | Baran, Jr. et al. |
| 2008/0241414 | A1 | | 10/2008 | Kim et al. |
| 2010/0021704 | A1 | | 1/2010 | Yoon et al. |

(Continued)

FOREIGN PATENT DOCUMENTS

| CN | 101395233   | 3/2009 |
| JP | 2007-254635 A | 10/2007 |

(Continued)

OTHER PUBLICATIONS

Ash et al., Handbook of Solvents (2nd Edition), pp. 367 and 398 (2013).*

(Continued)

*Primary Examiner* — Mark Kopec
*Assistant Examiner* — Jaison Thomas
(74) *Attorney, Agent, or Firm* — Dentons US LLP (57) ABSTRACT

An exemplary embodiment of the present invention relates to a conductive metal ink composition comprising a conductive metal powder; a non-aqueous solvent; an organo phosphate compound; and a polymer coating property improving agent, and a method for forming a conductive pattern by using the conductive metal ink composition.

22 Claims, 3 Drawing Sheets

(56) References Cited

U.S. PATENT DOCUMENTS

| | | |
|---|---|---|
| 2010/0140564 A1 | 6/2010 | Overbreek et al. |
| 2010/0148131 A1 | 6/2010 | Kotake et al. |
| 2012/0031290 A1* | 2/2012 | Lee et al. .................... 101/395 |

FOREIGN PATENT DOCUMENTS

| | | |
|---|---|---|
| KR | 10-1997-0001404 B1 | 2/1997 |
| KR | 10-2002-0038495 A | 5/2002 |
| KR | 10-2006-0017686 A | 2/2006 |
| KR | 10-2008-0088712 A | 10/2008 |
| KR | 10-1184674 | 9/2012 |
| WO | 2008038976 | 4/2008 |
| WO | WO 2008-038976 | 4/2008 |
| WO | 2008111484 | 9/2008 |

OTHER PUBLICATIONS

Written Opinion of the International Search Report from PCT/KR2007/004672.

* cited by examiner

CONDUCTIVE METAL INK COMPOSITION, AND METHOD FOR FORMING A CONDUCTIVE PATTERN

DISCLOSURE

1. Technical Field

The present invention relates to a conductive metal ink composition and a method for forming a conductive pattern. More particularly, the present invention relates to a conductive metal ink composition that can form a conductive pattern having more improved conductivity and excellent adhesion strength to a board and minimize an agglomeration phenomenon of the conductive metal generated after high temperature sintering of the conductive pattern, and a method for forming a conductive pattern using the same. This application is a national stage application of PCT/KR2011/003403, filed on May 6, 2011, which claims priority from Korean Patent Application No. 10-2010-0043431, filed on May 10, 2010 in the Korean Intelletual Property Office, both of which are incorporated herein by reference in their entirety.

2. Background Art

Currently, various flat display devices are widely used. In order to manufacture the flat display device, various conductive patterns such as electrodes, wires, or electromagnetic wave blocking filters are formed on a substrate, and the most widely used process for forming these patterns is photolithography.

However, in order to form a pattern by the photolithography, various processes such as coating, exposing, developing and etching of a photosensitive material should be performed, thereby making an entire device manufacturing process complicated and largely reducing economic efficiency of the process.

To this end, currently, an interest for a method for forming a conductive pattern by an inkjet printing method or a roll printing method is growing. In particular, in the case of the roll printing method, since there is an advantage in a process, in that it is possible to form a fine conductive pattern that is difficult to be formed by the inkjet printing method, the method is receiving a more large attention.

However, in order to form the good conductive pattern by the roll printing method, the conductive ink composition for forming the conductive pattern should have a low initial viscosity and be coated well on the roller, and should be transferred well on the substrate in a desired pattern form after being coated on the roller. In addition, since the conductive metal included in the conductive ink composition has poor adhesion strength to the board and is easily agglomerated in the sintering process, surface characteristics of the conductive pattern and physical properties of the final product may be reduced. Accordingly, there is required a conductive ink composition having characteristics suitable to form a good conductive pattern by a roll printing method and high adhesion strength to a board.

However, until now, a conductive ink composition that can form a fine conductive pattern well by a roll printing method has not been yet developed. Moreover, in the case where the previously developed conductive ink composition is applied, the conductivity and the adhesion strength to the board of the conductive pattern were not sufficient, and as a result, there is required development for a conductive ink composition that can form a fine conductive pattern having more excellent characteristics.

DISCLOSURE

Technical Problem

The present invention has been made in an effort to provide a conductive metal ink composition that can form a conductive pattern having more improved conductivity and excellent adhesion strength to a board and minimize an agglomeration phenomenon of the conductive metal generated after high temperature sintering of the conductive pattern.

In addition, the present invention has been made in an effort to provide a method for forming a conductive pattern by using the conductive metal ink composition.

Technical Solution

An exemplary embodiment of the present invention provides a conductive metal ink composition comprising a conductive metal powder; a non-aqueous solvent comprising a first non-aqueous solvent having a vapor pressure of 3 torr or less at 25° C. and a second non-aqueous solvent having a vapor pressure of more than 3 torr at 25° C.; an organophosphate compound; and a polymer coating property improving agent.

Another exemplary embodiment of the present invention provides a method for forming a conductive pattern, comprising coating the conductive metal ink composition on a roller; forming a pattern of the ink composition corresponding to the conductive pattern on the roller by contacting a cliché where the pattern corresponding to the conductive pattern is intaglioed with the roller; transferring the ink composition pattern on the roller on a substrate; and sintering the pattern transferred on the substrate.

Advantageous Effects

According to exemplary embodiments of the present invention, there are provided a conductive metal ink composition that can form a conductive pattern having more improved conductivity and excellent adhesion strength to a board and minimize an agglomeration phenomenon of the conductive metal generated after high temperature sintering of the conductive pattern, and a method for forming a conductive pattern using the same.

In particular, if the exemplary embodiments are applied to a roll printing process, an effect thereof is particularly excellent.

BEST MODE

Hereinafter, a conductive metal ink composition and a method for forming a conductive pattern according to a detailed exemplary embodiment of the invention will be described in more detail.

An exemplary embodiment of the present invention may provide a conductive metal ink composition comprising a conductive metal powder; a non-aqueous solvent comprising a first non-aqueous solvent having a vapor pressure of 3 torr or less at 25° C. and a second non-aqueous solvent having a vapor pressure of more than 3 torr at 25° C.; an organophosphate compound; and a polymer coating property improving agent.

In the exemplary embodiment of the present invention, an organo phosphate compound means an organic compound comprising a phosphoric acid.

The present inventors have performed experiments, resulting in the finding that if the conductive metal ink composition comprising the non-aqueous solvent and the organophosphate compound is used, it is possible to more preferably transfer a desired pattern form on a substrate, preferably form a fine conductive pattern, allow the conductive pattern to have high adhesion strength to a board, and minimize an agglomeration phenomenon of a conductive metal generated after high temperature sintering of the conductive pattern, thereby accomplishing the invention.

Since the conductive metal powder has a property not easily being attached to the board such as glass, in the roll printing process for applying the known conductive metal ink composition, it was difficult to stably form the conductive pattern. Besides, if the conductive metal such as silver (Ag) is fired at a high temperature, since the metal is easily agglomerated, surface characteristics of the conductive pattern become poor, such that physical properties of the final product such as conductivity were reduced.

Therefore, the present inventors have continuously performed a study for the conductive metal ink composition, resulting in the finding through experiments that if the organo phosphate compound is applied, problems of stability and adhesion strength to the board of the conductive pattern can be solved. The organo phosphate compound is distributed between the conductive metal powders and improves the adhesion strength between the board such as glass and the conductive metal powders, such that it is possible to minimize a peeling phenomenon of the conductive pattern film formed from the ink composition. Accordingly, the conductive pattern formed from the conductive metal ink composition according to the exemplary embodiment of the present invention can be maintained while being firmly adhered to the board without the peeling phenomenon even though a PECVD process of a severe condition comprised in the flat display manufacturing process using TFT is applied. Therefore, if the roll printing process is applied by using the conductive metal ink composition comprising the organophosphate compound, the adhesion strength to the substrate is largely improved, and it is possible to obtain the conductive pattern where conductive metal particles are uniformly dispersed even after the sintering process at a high temperature.

Meanwhile, the conductive metal ink composition comprises a first and a second non-aqueous solvents having different vapor pressures at normal temperature as a medium. The first and the second non-aqueous solvents have different volatilities due to different vapor pressures, and in particular, the first non-aqueous solvent has the low vapor pressure at normal temperature and the low volatility. Accordingly, the conductive metal ink composition comprising the first and the second non-aqueous solvents has the low viscosity during the storage and until the composition is coated on the roller for roll printing, and the uniform composition such as a conductive metal powder may be maintained in the medium comprising the first and the second non-aqueous solvents.

Therefore, the conductive metal ink composition is easily uniformly coated on the roller.

In addition, if the conductive metal ink composition is exposed to the air because of the high volatility of the second non-aqueous solvent in the medium, the second non-aqueous solvent is immediately volatilized, and the viscosity may be largely increased within approximately several minutes. Accordingly, it is easy to pattern the ink composition coated on the roller in a desired form, and the ink composition may maintain the good pattern form while the ink composition does not flow down from the roller even after the pattern is formed.

Therefore, if the roll printing process is applied by using the conductive metal ink composition, a desired pattern form may be more well transferred on the substrate, and the fine conductive pattern may be well formed.

Meanwhile, the conductive metal ink composition according to the exemplary embodiment of the present invention comprises the conductive metal powder. As the conductive metal powder, a predetermined metal powder that is known to show the electroconductivity may be used, and for example, one or more metal powders selected from silver (Ag), copper (Cu), gold (Au), chromium (Cr), aluminum (Al), tungsten (W), zinc (Zn), nickel (Ni), iron (Fe), platinum (Pt), palladium (Pd), and lead (Pb) may be used. The conductive metal powder may have a nanoscaled average particle diameter so that the conductive metal powder is uniformly dispersed in the ink composition and the conductive pattern formed from the ink composition has excellent and uniform conductivity. For example, the conductive metal powder may have the average particle diameter of 1 to 100 nm, preferably 5 to 70 nm, and more preferably 5 to 50 nm.

The conductive metal powder may be comprised in the content of 15 to 30 parts by weight on the basis of 100 parts by weight of the total ink composition. If the content of the conductive metal powder is excessively small, the conductivity of the conductive pattern formed from the ink composition may not be sufficient, and on the other hand, if the content is excessively large, dispersibility of the metal powder in the ink composition becomes poor, such that characteristics of the conductive pattern become poor or it may be difficult to uniformly coat the ink composition.

In addition, the conductive metal ink composition comprises the first and the second non-aqueous solvents. The first non-aqueous solvent is a solvent having the vapor pressure of 3 torr or less at 25° C. and showing relatively low volatility, and may act as a dispersing medium of the ink composition until the sintering.

As the first non-aqueous solvent, a predetermined non-aqueous solvent that is known to have the vapor pressure of 3 torr or less at 25° C. may be used, and for example, an alcohol-based solvent, a glycol-based solvent, a polyol-based solvent, a glycol ether-based solvent, a glycol ether ester-based solvent, a ketone-based solvent, a hydrocarbon-based solvent, a lactate-based solvent, an ester-based solvent, an aprotic sulfoxide-based solvent or a nitrile-based solvent having the vapor pressure of 3 torr or less at 25° C. may be used, or a mixture solvent comprising two or more kinds selected therefrom may be used. As more detailed examples of the first non-aqueous solvent, there may be ethyleneglycol, propyleneglycol, glycerol, propyleneglycol propylether, ethyleneglycol monophenylether, ethyleneglycol monoisopropylether, propyleneglycol monobutylether, diethyleneglycol monobutylether, diethyleneglycol monobutylether acetate, diethyleneglycol ethylether, N-methylpyrrolidone, hexadecane, pentadecane, tetradecane, tridecane, dodecane, undecane, decane, DMSO, acetonitrile or butylcellosolve, and a mixture solvent comprising two or more kinds selected therefrom may be used.

Meanwhile, the second non-aqueous solvent is a solvent having the vapor pressure of more than 3 torr at 25° C. and high volatility, and as described above, a component maintains the low viscosity of the ink composition and excellent coating property to the roller in conjunction with the first non-aqueous solvent until the ink composition is coated on the roller, and is removed by volatilization, thus increasing the viscosity of the ink composition and allowing the forming and the maintaining of the pattern on the roller to be well performed.

As the second non-aqueous solvent, a predetermined non-aqueous solvent that is known to have the vapor pressure of more than 3 torr at 25° C. may be used, and for example, an alcohol-based solvent, a glycol ether-based solvent, a glycol ether ester-based solvent, a ketone-based solvent, a hydrocarbon-based solvent, a lactate-based solvent, an ester-based solvent, an aprotic sulfoxide-based solvent or a nitrile-based solvent having the vapor pressure of more than 3 torr at 25° C. may be used, or a mixture solvent comprising two or more kinds selected therefrom may be used. As more detailed examples of the second non-aqueous solvent, there may be methanol, ethanol, propanol, isopropanol, n-butanol, t-butanol, pentanol, hexanol, nonan, octane, heptane, hexane, acetone, methylethylketone, methylisobutylketone, methylcellosolve, ethylcellosolve, ethyleneglycol dimethylether, ethyleneglycol diethylether, propyleneglycol methylether acetate, chloroform, methylene chloride, 1,2-dichloroethane, 1,1,1-trichloroethane, 1,1,2-trichloroethane, 1,1,2-trichloroethane, cyclohexane, tetrahydrofurane, acrylonitrile, benzene, toluene or xylene, and a mixture solvent of two or more kinds selected therefrom may be used.

The first and the second non-aqueous solvents described above may be comprised in the contents of 5 to 70 parts by weight and 10 to 74 parts by weight on the basis of 100 parts by weight of the total ink composition, respectively.

In the case where the content of the first non-aqueous solvent is excessively small or the content of the second non-aqueous solvent is excessively large, after the ink composition is coated on the roller, a drying speed becomes fast, such that it is difficult to perform transferring on the substrate. On the other hand, if the content of the first non-aqueous solvent is excessively large or the content of the second non-aqueous solvent is excessively small, the drying speed becomes slow, such that a process time is lengthened and it is difficult to uniformly coat the ink composition.

Meanwhile, if the organo phosphate compound can be easily mixed with the first and the second non-aqueous solvents, a kind thereof is not limited. As an example of the organo phosphate compound satisfying the above condition, there is organo phosphate ester, in detail, alkyl phosphate, alkyl ether phosphate, and a derivative thereof, and in more detail, the example may be represented by the following Formula 1.

The organo phosphate compound may comprise a compound of the following Formula 1.

[Formula 1]

wherein $R_1$ and $R_2$ may be each independently hydrogen, alkyl having 1 to 20 carbon atoms, polyalkylene oxide comprising 1 to 5 repeating units of alkylene oxide having 1 to 4 carbon atoms, or a combination thereof, $R_3$ may be alkyl having 1 to 20 carbon atoms, alkenyl having 2 to 20 carbon atoms, aryl having 6 to 20 carbon atoms, acrylate or methacrylate, and A may be polyalkylene oxide comprising 1 to 20 repeating units of alkylene oxide having 1 to 4 carbon atoms. In this case, alkyl and alkenyl of $R_1$, $R_2$, and $R_3$ may include linear chain and branched chain structures.

Preferably, in Formula 1, $R_1$ and $R_2$ may be each independently hydrogen or alkyl having 1 to 4 carbon atoms, and $R_3$ may be alkyl having 1 to 10 carbon atoms, allyl, phenyl or methacrylate.

More preferably, in Formula 1, $R_3$ may be methacrylate or acrylate, and A may be polyalkylene oxide comprising 1 to 20 repeating units of alkylene oxide having 1 to 3 carbon atoms.

Even more preferably, in Formula 1, $R_3$ may be methacrylate, and A may be polyethylene oxide comprising 1 to 20 repeating units of ethylene oxide.

The organo phosphate compound may be comprised, on the basis of 100 parts by weight of the total ink composition, in the content of 0.01 to 6 parts by weight, preferably 0.05 to 5 parts by weight, and more preferably 0.1 to 5 parts by weight. If the content of the organo phosphate compound is excessively small, the adhesion strength to the board of the conductive pattern may not be sufficiently improved, and agglomeration of the conductive metal powder may easily occur after high temperature sintering, and if the content of the organo phosphate compound is excessively large, a resistance value of the conductive pattern after the sintering process may be largely increased, and there may be inconvenient when the process is performed because the viscosity of the ink composition is increased.

Meanwhile, the conductive metal ink composition may comprise a polymer coating property improving agent. The coating property improving agent acts as a binder in the ink composition, and is a component that provides an adhesion property to the ink composition so that the ink composition is well coated or transferred on the roller and the substrate on which the conductive pattern is formed.

As the coating property improving agent, an epoxy-based polymer, a phenol-based polymer or an alcohol-based polymer may be used, and a mixture of two or more kinds selected therefrom may be used. As a detailed example of the epoxy-based polymer of the coating property improving agent, there are a bisphenol A epoxy polymer, a bisphenol F epoxy polymer, a novolac epoxy polymer, an inflammable epoxy polymer such as an epoxy bromide polymer, an epoxy polymer having an aliphatic cycle, a rubber denatured epoxy polymer, an aliphatic polyglycidyl epoxy polymer or a glycidyl amine epoxy polymer. In addition, as a more detailed example of the phenol-based polymer, there are a novolac phenol polymer or a resol phenol polymer, and as the alcohol-based polymer, there may be a cellulose-based polymer, polyvinylalcohol, an ethylenevinylalcohol polymer or a polyurethane diol-based polymer. Besides, ethylenevinylacetate, a rosin-based resin, a styrene-butadiene-styrene-based polymer or a polyester-based polymer may be used.

A material that is widely known or commercialized in the art as the material that belongs to the detailed examples may be used as the coating property improving agent, and in addition to the materials, various polymer materials that are known to be used in the conductive ink composition may be used as the coating property improving agent.

Since the ink composition comprises the coating property improving agent, the ink composition may show an excellent coating property to the roller and an excellent transferring property to the substrate, such that the composition can be appropriately applied to the roll printing process, and a finer conductive pattern may be well formed on the substrate.

The polymer coating property improving agent may be comprised in the content of 0.01 to 5 parts by weight on the basis of 100 parts by weight of the total ink composition. If the content of the coating property improving agent is excessively small, the coating property or the transferring property of the ink composition may not be sufficient, and on the other hand, if the content is excessively large, the conductivity of the conductive pattern formed from the ink composition may not be sufficient.

Meanwhile, the conductive metal ink composition according to the exemplary embodiment of the present invention may further comprise an organic silver complex compound forming a complex by bonding the organic ligand comprising an amine group and a hydroxy group to an aliphatic silver (Ag) carboxylate.

The organic silver complex compound may be exemplified by the compound disclosed in Korean Unexamined Patent Application Publication No. 2008-0029826, and may have high solubility to the solvent, maintain a liquid phase at normal temperature, and show excellent stability in the ink composition without a separate dispersing agent. That is, the organic silver complex compound may act as a sort of medium and comprises silver (Ag). If the organic silver complex compound is comprised in the conductive metal ink composition, while the content of the non-aqueous solvent comprised in the ink composition is reduced, more contents of conductive metal components, for example, silver (Ag) or other conductive powders may be included. Therefore, in conjunction with the conductive metal powder, the conductive metal ink composition comprising the organic silver complex compound may show more improved conductivity.

The organic silver complex compound may be formed by bonding the organic ligand selected from the group consisting of primary to quaternary amines substituted by the alcohol group to the aliphatic silver carboxylate. In addition, the aliphatic silver carboxylate may be selected from the group consisting of primary or secondary fatty acid silver (Ag) salts having 2 to 20 carbon atoms. The organic ligand and the aliphatic silver carboxylate (Ag) constituting the organic silver complex compound may be bonded to each other in an equivalence ratio of 1:1 to 5:1 to form a complex, and the equivalence ratio of 2:1 is preferable.

In addition, since the organic silver complex compound has a complex form, the compound shows the low crystallinity and excellent solubility to the solvent, and may have a liquid phase at normal temperature. Since the organic silver complex compound may act as a liquid phase medium, while the content of the medium comprised in the ink composition, that is, the non-aqueous solvent is reduced, more contents of conductive metal components, for example, the content of the silver (Ag) component comprised in the conductive metal powder or the complex compound may be increased by comprising the compound in the ink composition in the more content. Therefore, it is found that the conductive pattern having more improved conductivity may be formed by the roll printing process by applying the ink composition.

Since the organic silver complex compound comprises the organic ligand and the aliphatic silver carboxylate in an equivalence ratio of 1:1 to 5:1 and has 1 to 5 hydroxy groups per one molecule, for example, the high viscosity of 50 to 2000 cPs may be shown at normal temperature (about 25° C.). Accordingly, the organic silver complex compound may act preferably as a sort of medium of the ink composition and allow the ink composition to maintain excellent dispersion stability in the low content of the non-aqueous solvent.

Therefore, if the ink composition further comprises the organic silver complex compound, it is possible to well form the conductive pattern having higher density of the conductive metal component and excellent conductivity therefrom.

The organic silver complex compound, as disclosed in Korean Unexamined Patent Application Publication No. 2008-0029826, may be manufactured by using a method for reacting the organic ligand and the aliphatic silver carboxylate under the solvent, and as the solvent, alcohols such as methanol, ethanol, and terpineol, or glycol ethers such as butylcarbitol acetate and butyl cellosolve, and butyl carbitol may be used.

The organic silver complex compound may be comprised in the content of 0.1 to 5 parts by weight, and preferably 1 to 5 parts by weight, on the basis of 100 parts by weight of the total ink composition. If the content of the organic silver complex compound is excessively small, the conductivity of the conductive pattern formed from the ink composition may not be sufficient, and if the content of the organic silver complex compound is excessively large, the viscosity of the ink composition is increased, such that inconvenience may occur when the process is performed.

Meanwhile, the conductive ink composition according to the exemplary embodiment of the present invention may further comprise a surfactant. As the surfactant, a general leveling agent, for example, silicon-based, fluorine-based or polyether-based surfactant may be used. It is preferable that the content of the surfactant is 0.01 to 5 parts by weight on the basis of 100 parts by weight of the total ink composition. The conductive ink composition according to the exemplary embodiment of the present invention may be manufactured by mixing the above components with each other and filtering the components by using a filter, if necessary.

On the other hand, the conductive metal ink composition according to the exemplary embodiment of the present invention may have an initial viscosity of 10 cPs or less, and preferably 0.7 to 5 cPs.

In this case, the initial viscosity means a total viscosity from initial manufacturing of the conductive metal ink composition to coating of the composition on the roller for the roll printing process. The conductive metal ink composition may have the low initial viscosity by comprising the first and the second non-aqueous solvents, such that the composition may show excellent coating property to the roller. In addition, after the coating to the roller, because of the vaporization of the second non-aqueous solvent having the high volatility, the viscosity on the roller may be increased, such that the pattern may be well formed and maintained on the roller and the pattern may be well transferred on the substrate.

Therefore, by applying the roll printing process by using the conductive metal ink composition, it is possible to well form finer conductive patterns on the substrate and the conductive pattern may show the more excellent conductivity.

Therefore, the conductive metal ink composition may be printed on the substrate, for example, a glass substrate, by the roll printing process, to be preferably applied in order to form the conductive pattern, and in particular, the composition may be very preferably applied in order to form an electrode pattern of a flat display device.

According to another exemplary embodiment of the present invention, there is provided a method for forming the conductive pattern by using the conductive metal ink composition described above. The method for forming a conductive pattern may comprise coating the conductive metal ink composition on a roller; forming a pattern of the ink composition corresponding to the conductive pattern on the roller by contacting a cliché where the pattern corresponding to the conductive pattern is intaglioed with the roller; transferring the ink composition pattern on the roller on a substrate; and sintering the pattern transferred on the substrate.

In the method for forming the conductive pattern, the cliché means an uneven plate that is used in order to pattern the ink composition coated on the roller in a desired conductive pattern form. To this end, the pattern corresponding to the conductive pattern may be intaglioed on the cliché.

Figure 1:
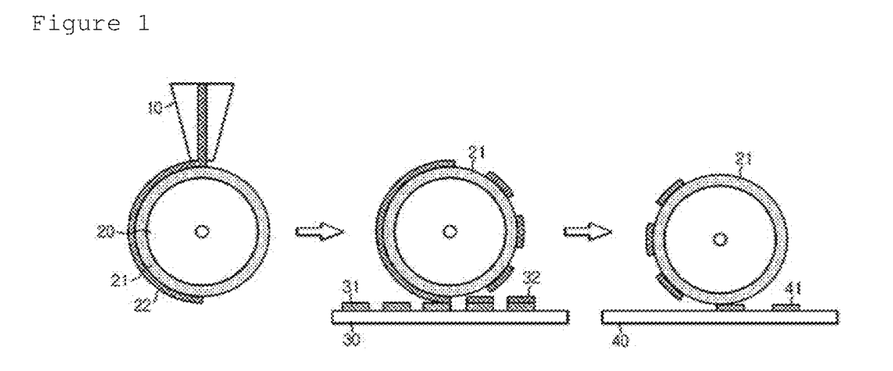
FIG. 1 schematically illustrates a process for forming a conductive pattern through a roll printing process.

Meanwhile, with reference to the accompanying drawings, the method for forming the conductive pattern according to another exemplary embodiment of the present invention will be described for each step. FIG. 1 is a view that schematically illustrates a process for forming a conductive pattern through a roll printing process.

First, the conductive metal ink composition described above is formed. To this end, the components are mixed, and agitated or stirred, thereby forming the uniform ink composition. In addition, in order to remove an impurity and uniformly form the conductive pattern, a step for filtering the ink composition may be further performed.

Subsequently, the conductive ink composition 22 is coated on a roller 20.

In this case, the outer surface of the roller 20 may be covered with a blanket 21, and the blanket 21 may be formed of polymethylselloxane (PDMS). Since the PDMS has excellent viscoelasticity, deformation property or transferring property as compared to other polymer materials, the PDMS can be appropriately used as the blanket 21. The conductive ink composition 22 may be coated on the blanket 21 by being discharged from a discharging part 10 of a supplying device, and from this point, the second non-aqueous solvent starts to be vaporized, and the viscosity of the ink composition 22 starts to be rapidly increased.

After the ink composition 22 is coated on the blanket 21, the pattern of the ink composition corresponding to the conductive pattern is formed on the roller by contacting the cliché where the pattern corresponding to the desired conductive pattern is intaglioed with the roller.

That is, the cliché 30 selectively removes an ink portion 32 where it is not necessary to form the conductive pattern by contacting the cliché with the blanket 21 on which the ink composition 22 is coated, such that the pattern of the ink composition corresponding to the desired conductive pattern may be formed on the roller. To this end, the cliché 30 is formed in such a manner that the pattern corresponding to the desired conductive pattern is intaglioed on the surface contacted with the blanket 21, such that the ink portion 32 where it is not necessary to form the conductive pattern may be transferred on the protrusion 31 and removed by contacting only the protrusion 31 of the cliché 30 with the ink composition 22 on the blanket 21.

After the pattern of the ink composition is formed on the roller, the pattern of the ink composition is transferred on the substrate. To this end, the blanket 21 of the roller where the pattern of the ink composition is formed may be contacted with the substrate 40, such that a predetermined pattern 41 may be formed on the substrate 40 by transferring the pattern of the ink composition on the substrate 40.

After the pattern is transferred, the conductive pattern may be formed on the substrate by performing a sintering process. The sintering process may be performed under the appropriate condition according to a kind of the conductive pattern to be formed, and for example, in the case where the conductive pattern becomes the electrode pattern of the flat display device, the sintering process may be performed at 600° C. or less, for example, 350 to 600° C. for 5 to 50 min, and for example, at 450° C. for 10 to 40 min.

As described above, through the method for forming the conductive pattern by using the roll printing process, it is possible to form the conductive pattern on the substrate by a very simple and rapid process as compared to a photolithography process applied in the related art. In addition, since in the roll printing process, the conductive metal ink composition according to the exemplary embodiment of the present invention is used, the fine conductive pattern having excellent conductivity, for example, the electrode pattern of the flat display device may be well formed.

According to another exemplary embodiment of the invention, there is provided a conductive pattern that is obtained by transferring the conductive metal ink composition on the substrate and sintering the transferred pattern.

MODE FOR INVENTION

The invention will be described in more detail in the following Examples. However, the following Examples are set forth to illustrate but are not to be construed to limit the present invention.

EXAMPLE

Conductive Metal Ink Composition and Formation of Conductive Pattern

Example 1

3 g of the silver nanoparticles having the average particle diameter of 50 nm, 0.8 g of methyl cellosolve (vapor pressure of 6.2 torr at 25° C.), 2.5 g of ethanol (vapor pressure of 59.3 torr at 25° C.), 3.5 g of butyl cellosolve (vapor pressure of 0.76 torr at 25° C.), 0.2 g of phenol aldehyde novolac resin that was a sort of the phenol-based polymer, and 0.06 g of the silicon-based surfactant were mixed with each other and agitated for 12 hours. In addition, 0.03 g of PAM-100 (Rhodia Co., Ltd.) that was phosphate esters of polyethylene glycol methacrylate was added to the agitated mixture as described above, agitated for 12 hours, and filtered by using the filter of 1 μm to manufacture the ink composition.

After the ink composition was coated on the PDMS blanket of the roller, the pattern of the ink composition was formed on the roller by contacting a cliché where the pattern corresponding to the desired conductive pattern was intaglioed with the blanket. Thereafter, the pattern was formed on the glass substrate by contacting the roller with the glass substrate. The conductive pattern was formed by sintering the above pattern in the heat sintering furnace at 450° C. for 30 min.

Example 2

The ink composition was manufactured and the conductive pattern was formed by using the same method as Example 1, except that 0.15 g of PAM-100 was used instead of 0.03 g of PAM-100.

Example 3

The ink composition was manufactured and the conductive pattern was formed by using the same method as Example 1, except that 0.15 g of Ag (hexanoate) (2-methylaminoethanol) 2 and 0.003 g of PAM-100 were used instead of 0.03 g of PAM-100.

Example 4

The ink composition was manufactured and the conductive pattern was formed by using the same method as Example 1, except that 0.15 g of Ag (hexanoate) (2-methylaminoethanol) 2 and 0.03 g of PAM-100 were used instead of 0.03 g of PAM-100.

Example 5

The ink composition was manufactured and the conductive pattern was formed by using the same method as Example 1, except that 0.03 g of PAM-200 (Rhodia Co., Ltd.) that was phosphate esters of polypropylene glycol methacrylate was used instead of 0.03 g of PAM-100.

Example 6

The ink composition was manufactured and the conductive pattern was formed by using the same method as Example 1, except that 0.15 g of Ag (hexanoate) (2-methylaminoethanol) 2 and 0.003 g of PAM-200 were used instead of 0.03 g of PAM-100.

Example 7

The ink composition was manufactured and the conductive pattern was formed by using the same method as Example 1, except that 0.03 g of PAM-300 (Rhodia Co., Ltd.) that was phosphate esters of polypropylene glycol methacrylate was used instead of 0.03 g of PAM-100.

Example 8

The ink composition was manufactured and the conductive pattern was formed by using the same method as Example 1, except that 0.15 g of Ag (hexanoate) (2-methylaminoethanol) 2 and 0.003 g of PAM-300 were used instead of 0.03 g of PAM-100.

Example 9

The ink composition was manufactured and the conductive pattern was formed by using the same method as Example 1, except that 0.03 g of RS-410 (Rhodia Co., Ltd.) that was polypropylene glycol tridecyl ether phosphate was used instead of 0.03 g of PAM-100.

Example 10

The ink composition was manufactured and the conductive pattern was formed by using the same method as Example 1, except that 0.03 g of tris(2-butyoxyethyl) phosphate was used instead of 0.03 g of PAM-100.

Example 11

The ink composition was manufactured and the conductive pattern was formed by using the same method as Example 1, except that 0.15 g of Ag (hexanoate) (2-methylaminoethanol) 2 and 0.003 g of tris(2-butyoxyethyl) phosphate were used instead of 0.03 g of PAM-100.

COMPARATIVE EXAMPLE

Conductive Metal Ink Composition and Formation of Conductive Pattern

Comparative Example 1

3 g of the silver nanoparticles having the average particle diameter of 50 nm, 0.8 g of methyl cellosolve (vapor pressure of 6.2 torr at 25° C.), 2.5 g of ethanol (vapor pressure of 59.3 torr at 25° C.), 3.5 g of butyl cellosolve (vapor pressure of 0.76 torr at 25° C.), and 0.2 g of phenol aldehyde novolac resin that was a sort of the phenol-based polymer were mixed with each other. The mixture was agitated for 12 hours and filtered by using the filter of 1 μm to manufacture the ink composition.

After the ink composition was coated on the PDMS blanket of the roller, the pattern of the ink composition was formed on the roller by contacting a cliché where the pattern corresponding to the desired conductive pattern was intaglioed with the blanket. Thereafter, the pattern was formed on the glass substrate by contacting the roller with the glass substrate. The conductive pattern was formed by sintering the above pattern in the heat sintering furnace at 450° C. for 30 min.

EXPERIMENTAL EXAMPLE

Experimental Example 1

Adhesion Property Test

The adhesion properties of the conductive patterns formed in Examples 1 to 11 and Comparative Example 1 were evaluated on the basis of the ASTM D3359 method (cross cutting tape test). In detail, 11 lines were drawn in horizontal and vertical directions at an interval of 1 mm respectively on the conductive patterns of Examples 1 to 11 and Comparative Example 1, and the ratio of areas removed when the magic tape manufactured by 3M Co., Ltd. was detached after being attached was evaluated.

In this case, in the case where the ratio of the removed area was 0 to 10%, the ratio was evaluated as '⊚⊚', in the case where the ratio of the removed area was 10 to 20%, the ratio was evaluated as '⊚', in the case where the ratio of the removed area was 20 to 30%, the ratio was evaluated as '○', and in the case where the ratio of the removed area was more than 30%, the ratio was evaluated as 'X'.

Experimental Example 2

Measurement of Specific Resistance of the Conductive Pattern

The surface resistances of the conductive patterns of Examples 1 to 11 and Comparative Example 1 were measured by using the 4-point probe (MCP-T600, Mitsubishi Chemical Corp.), the thickness was measured by using the Alpha step surface profiler (Alpha tep IQ, Tencor Co., Ltd.), and specific resistances of the conductive patterns of Examples 1 to 11 and Comparative Example 1 were obtained.

The results of Experimental Examples 1 and 2 are described in the following Table 1.

TABLE 1

Results of adhesion property test and measurement of specific resistance of Examples and Comparative Example

| | TAPE TEST RESULT | SPECIFIC RESISTANCE ($\mu\Omega \cdot cm$) |
|---|---|---|
| EXAMPLE 1 | ○ | 42.13 |
| EXAMPLE 2 | ○ | 46.49 |
| EXAMPLE 3 | ⊚⊚ | 2.97 |
| EXAMPLE 4 | ⊚ | 22.42 |
| EXAMPLE 5 | ⊚ | 30.13 |
| EXAMPLE 6 | ⊚ | 24.77 |
| EXAMPLE 7 | ○ | 33.09 |

TABLE 1-continued

Results of adhesion property test and measurement of specific resistance of Examples and Comparative Example

| | TAPE TEST RESULT | SPECIFIC RESISTANCE (μΩ·cm) |
|---|---|---|
| EXAMPLE 8 | ◎ | 28.84 |
| EXAMPLE 9 | ○ | 20.11 |
| EXAMPLE 10 | ◎ | 26.93 |
| EXAMPLE 11 | ◎ | 18.24 |
| COMPARATIVE EXAMPLE 1 | X | 79.60 |

Experimental Example 3

X-Ray Diffraction Analysis Test

The X-ray diffraction analysis data of the pattern formed by using the ink compositions of Examples 2 and 4 and Comparative Example 1 and the conductive pattern formed by sintering in the heat sintering furnace at 450° C. for 30 min were measured by using the X-ray diffractometer (Autosampler X-ray diffraction system), respectively. Through this, the size of the crystallite was obtained.

Figure 2:
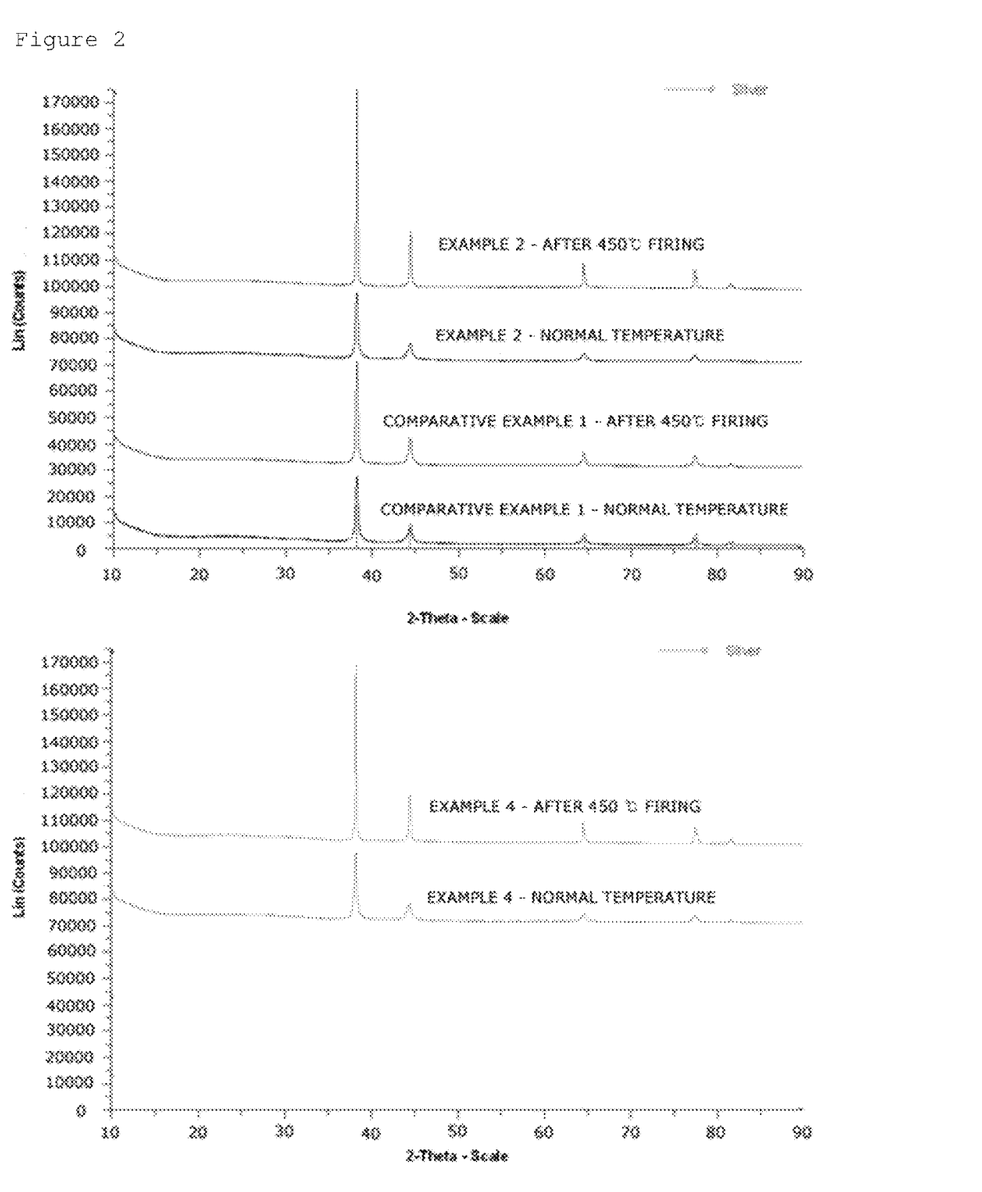
FIG. 2 illustrates XRD peaks before and after sintering of the conductive pattern formed by using the ink compositions of Examples 2 and 4 and Comparative Example 1.

In addition, the X-ray diffraction analysis data are described in FIG. 2 and the following Table 2.

TABLE 2

| | Size of crystallite | |
|---|---|---|
| | SIZE OF CRYSTALLITE (nm) | |
| | BEFORE SINTERING | AFTER 450° C. SINTERING |
| EXAMPLE 2 | 29.8 | 106.9 |
| EXAMPLE 4 | 28.0 | 105.2 |
| COMPARATIVE EXAMPLE 1 | 28.0 | 41.1 |

As shown in Table 2 and FIG. 2, it can be seen that the size of the crystallite is largely increased after the high temperature sintering of the conductive patterns formed in Examples 2 and 4, that is, the size of the crystal of Ag is increased, such that an adhesion surface area is increased. Accordingly, in Examples 2 and 4, since the adhesion surface area after the sintering is increased, the conductive pattern may have improved adhesion performance.

On the other hand, since the crystallite is not enlarged even after the high temperature sintering of the conductive pattern formed in Comparative Example 1, there is no large change in the crystal size of the particle and the adhesion surface area on the ink composition.

That is, in the conductive patterns of Examples 2 and 4, since the organo phosphate compound prevents agglomeration between the conductive metal powders, it is possible to improve dispersibility therebetween and increase the surface area, such that it is expected that the adhesion property and the conductivity of the conductive pattern to the glass board will be more improved.

Experimental Example 4

Observation of the Surface Shape of the Conductive Pattern

The surfaces of the conductive patterns formed in Examples 2 to 4 and Comparative Example 1 were observed by using the scanning electronic microscope (S-4800, HITACHI Co., Ltd.).

Figure 3:
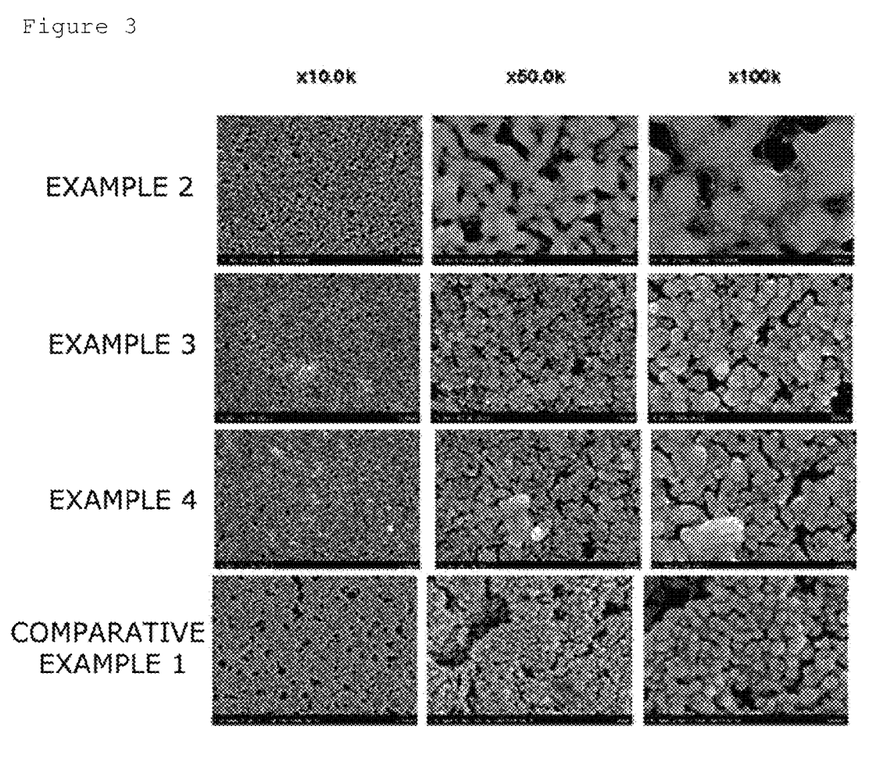
FIG. 3 illustrates SEM pictures of the conductive patterns formed in Examples 2 to 4 and Comparative Example 1.

In FIG. 3, it can be seen that the conductive metal powder on the conductive pattern formed in the Examples does not cause agglomeration, and particles are uniformly and densely distributed.

On the other hand, as shown in FIG. 3, in the conductive pattern formed in the Comparative Example, the particles are more densely distributed as compared to the Examples, and the particles are relatively less uniformly distributed.

The invention claimed is:

1. A conductive metal ink composition, comprising:
a conductive metal powder;
a non-aqueous solvent comprising a first non-aqueous solvent having a vapor pressure of 3 torr or less at 25° C. and a second non-aqueous solvent having a vapor pressure of more than 3 torr at 25° C.;
an organo phosphate compound; and
a polymer coating property improving agent,
wherein the organo phosphate compound comprises a compound of the following Formula 1:

[Formula 1]

wherein
$R_1$ and $R_2$ are each independently hydrogen, alkyl having 1 to 20 carbon atoms, polyalkylene oxide comprising 1 to 5 repeating units of alkylene oxide having 1 to 4 carbon atoms, or a combination thereof,
$R_3$ is acrylate or methacrylate, and
A is polyalkylene oxide comprising 1 to 20 repeating units of alkylene oxide having 1 to 4 carbon atoms.

2. The conductive metal ink composition according to claim 1, wherein the conductive metal ink composition is printed on a substrate by a roll printing process and used for forming a conductive pattern.

3. The conductive metal ink composition according to claim 2, wherein the conductive metal ink composition is used for forming an electrode of a flat display device.

4. The conductive metal ink composition according to claim 1, wherein the conductive metal powder comprises one or more metal powders selected from the group consisting of silver (Ag), copper (Cu), gold (Au), chromium (Cr), aluminum (Al), tungsten (W), zinc (Zn), nickel (Ni), iron (Fe), platinum (Pt), palladium (Pd), and lead (Pb).

5. The conductive metal ink composition according to claim 1, wherein the conductive metal powder has an average particle diameter of 1 to 100 nm.

6. The conductive metal ink composition according to claim 1, wherein the first non-aqueous solvent comprises one or more selected from the group consisting of an alcohol-based solvent, a glycol-based solvent, a polyol-based solvent, a glycol ether-based solvent, a glycol ether ester-based solvent, a ketone-based solvent, a hydrocarbon-based solvent, a lactate-based solvent, an ester-based solvent, an aprotic sulfoxide-based solvent, and a nitrile-based solvent having the vapor pressure of 3 torr or less at 25° C.

7. The conductive metal ink composition according to claim 1, wherein the second non-aqueous solvent comprises one or more selected from the group consisting of an alcohol-based solvent, a glycol ether-based solvent, a glycol ether ester-based solvent, a ketone-based solvent, a hydrocarbon-based solvent, a lactate-based solvent, an ester-based solvent, an aprotic sulfoxide-based solvent, and a nitrile-based solvent having the vapor pressure of more than 3 torr at 25° C.

8. The conductive metal ink composition according to claim 1, wherein the organo phosphate compound is organo phosphoric acid ester.

9. The conductive metal ink composition according to claim 1, wherein in Formula 1, A is polyalkylene oxide comprising 1 to 20 repeating units of alkylene oxide having 1 to 3 carbon atoms.

10. The conductive metal ink composition according to claim 1, wherein the polymer coating property improving agent is selected from the group consisting of an epoxy-based polymer, a phenol-based polymer, an alcohol-based polymer, ethylenevinylacetate, a rosin-based resin, a styrene-butadiene-styrene-based polymer, and a polyester-based polymer.

11. The conductive metal ink composition according to claim 1, further comprising:
an organic silver complex compound formed by a complex by bonding an organic ligand comprising an amine group and a hydroxy group with an aliphatic silver (Ag) carboxylate.

12. The conductive metal ink composition according to claim 11, wherein the aliphatic silver (Ag) carboxylate is selected from the group consisting of primary or secondary aliphatic acid silver (Ag) salts having 2 to 20 carbon atoms, and the organic ligand is selected from the group consisting of primary amines, secondary amines, tertiary amines, and quaternary amines wherein the amines are further substituted by an alcohol group.

13. The conductive metal ink composition according to claim 11, wherein in the organic silver complex compound, the organic ligand and the aliphatic silver carboxylate are bonded with each other at an equivalence ratio of 1:1 to 5:1.

14. The conductive metal ink composition according to claim 11, comprising:
on the basis of 100 parts by weight of the total conductive metal ink composition,
0.1 to 6 parts by weight of the organic silver complex compound.

15. The conductive metal ink composition according to claim 1, comprising:
on the basis of 100 parts by weight of the total conductive metal ink composition,
15 to 30 parts by weight of the conductive metal powder;
5 to 70 parts by weight of the first non-aqueous solvent;
10 to 74 parts by weight of the second non-aqueous solvent; and
0.01 to 5 parts by weight of the polymer coating property improving agent.

16. The conductive metal ink composition according to claim 1, comprising:
on the basis of 100 parts by weight of the total conductive metal ink composition,
0.01 to 5 parts by weight of the organo phosphate compound.

17. The conductive metal ink composition according to claim 1, further comprising a surfactant.

18. The conductive metal ink composition according to claim 1, wherein the conductive metal ink composition has an initial viscosity of 10 cPs or less.

19. A conductive pattern obtained by transferring the conductive metal ink composition according to claim 1 on a substrate and sintering the transferred pattern.

20. A method for forming a conductive pattern, comprising:
coating the conductive metal ink composition according to claim 1 on a roller;
contacting the conductive metal ink composition with a cliché to form a pattern of the ink composition corresponding to the conductive pattern on the roller, the pattern corresponding to the conductive pattern being intaglioed with the roller;
transferring the ink composition pattern on the roller on a substrate; and
sintering the pattern transferred on the substrate.

21. The method for forming a conductive pattern according to claim 20, wherein the conductive pattern is an electrode pattern of a flat display device.

22. The method for forming a conductive pattern according to claim 20, wherein the sintering is performed at 350 to 600° C. for 5 to 50 min.

* * * * *